United States Patent [19]
Seo et al.

[11] Patent Number: 5,378,986
[45] Date of Patent: Jan. 3, 1995

[54] MAGNETIC RESONANCE IMAGING APPARATUS

[75] Inventors: Yasutsugu Seo, Tokyo; Masafumi Kondo, Ootawara, both of Japan

[73] Assignee: Kabushiki Kaisha Toshiba, Kawasaki, Japan

[21] Appl. No.: 937,542

[22] Filed: Aug. 28, 1992

[30] Foreign Application Priority Data

Aug. 29, 1991 [JP] Japan .................... 3-218932

[51] Int. Cl.$^6$ .............................................. G01V 3/00
[52] U.S. Cl. ................................... 324/309; 324/307
[58] Field of Search ............... 324/300, 307, 309, 310, 324/311, 312, 314

[56] References Cited

U.S. PATENT DOCUMENTS

| | | | |
|---|---|---|---|
| 4,717,879 | 1/1988 | Riederer et al. | 324/307 |
| 4,733,188 | 3/1988 | Sekihara et al. | 324/312 |
| 4,767,991 | 8/1988 | Rzedzian | 324/312 |
| 4,845,430 | 7/1989 | Nakabayashi | 324/307 |
| 5,237,273 | 8/1993 | Plewes et al. | 324/307 |

OTHER PUBLICATIONS

J. Hennig, A. Nauerth, and H. Friedburg, "RARE Imaging: A Fast Imaging Method for Clinical/MR," Magnetic Resonance In Medicine 3, pp. 823–833 (1986).

Koichi Oshio and David A. Feinberg, "GRASE (Gradient-and Spin-Echo) Imaging: A Novel Fast MRI Technique," Magnetic Resonance In Medicine 20, pp. 344–349 (1991).

*Primary Examiner*—Louis Arana
*Attorney, Agent, or Firm*—Limbach & Limbach

[57] ABSTRACT

Where an imaging volume of an object under examination is comprised of eight slices with four regions "a", "b", "c", and "d" per slice (on the k space), the RF pulse frequency, the slice-selection gradient magnetic field, and the phase-encoding gradient magnetic field are controlled so as to first acquire data for a region "a" of each of the slices #1 to #8 in sequence and then acquire data for the slices #1 to #8 for each of the regions "b" to "d" in sequence. The data with 4 rows and 8 columns thus obtained for each of the regions of the slices is rearranged into data with 8 rows and 4 columns arranged for each of the slices. Data in each row are subjected to two-dimensional Fourier transformation, so that an MR image corresponding to each slice is reconstructed. This permits the RF pulse repetition time TR to be made long even if a time interval between successive data acquisition is made short. Thus, a multi-slice divisional-scanning type magnetic resonance imaging apparatus can be realized, which permits T2 contrast images with high signal-to-noise ratio to be obtained in a short time.

21 Claims, 8 Drawing Sheets

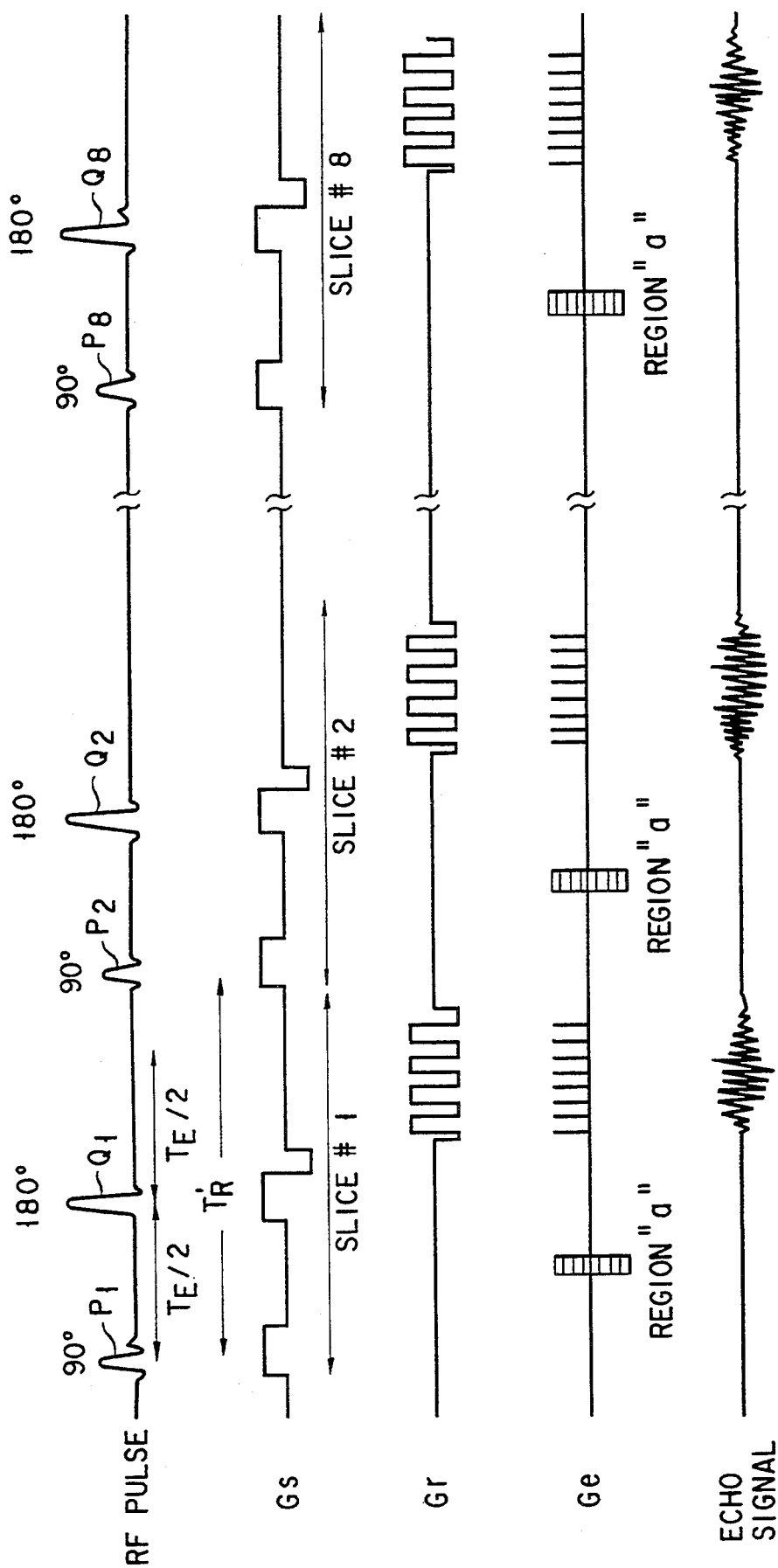
F I G. 4

MAGNETIC RESONANCE IMAGING APPARATUS

BACKGROUND OF THE INVENTION

1. Field of the Invention

The present invention relates to a magnetic resonance imaging apparatus for making a high speed scanning such as an echo planar imaging sequence, and more particularly to a multi-slice divisional-scanning type magnetic resonance imaging apparatus which acquires magnetic resonance echo signals (hereinafter referred to as echo signals) for a single slice in several scans in order to improve spatial resolution and acquires echo signals from multiple slices in a single pulse sequence in order to obtain three-dimensional information of an object under examination.

2. Description of the Related Art

In a prior art of such a magnetic resonance imaging apparatus (hereinafter referred to as MRI apparatus), as shown in FIG. 1, a single slice is divided into two or more regions (four regions "a", "b", "c", and "d" in this example) on the Fourier space or the k space, and an echo signal is acquired from each of the regions. It is assumed that an imaging volume of an object under examination is comprised of eight slices #1 to #8. Then, the regions "a", "b", "c" and "d" of the slice #1 on the k space are first scanned in sequence, as shown in FIG. 2. Next, the slice #2 is scanned in the order of the regions "a", "b", "c", and "d". Likewise, data for the regions "a", "b", "c", and "d" are acquired in sequence for each of the slices #3 to #7. Finally, data for the regions "a", "b", "c", and "d" of the slice #8 are acquired. The echo signal thus acquired for each of the slices is then subjected to two-dimensional Fourier transformation, thereby allowing a magnetic resonance image of each slice to be reconstructed. Having an advantage that echo signals can be acquired from multiple slices by the use of a single pulse sequence, the prior art suffers from a drawback that the scan time is long.

In general, MRI apparatuses suffer from a major problem that the scan time is long. From a consideration of deterioration in image quality due to physiological motion of a patient being examined, such as motion due to respiration, it is preferred that the scan time should be as short as possible. In the case of the multi-slice divisional-scanning method described above, however, in order to shorten the scan time, it is required to shorten the RF-pulse repetition time TR. If the repetition time TR were made short, transverse relaxation enhancement images (T2 contrast images) could not be obtained because of the influence of longitudinal relaxation, and the signal-to-noise ratio would also be degraded.

SUMMARY OF THE INVENTION

It is therefore an object of the present invention to provide a multi-slice divisional-scanning type magnetic resonance imaging apparatus which permits the RF-pulse repetition time to be made long without making the scan time long, thereby permitting a T2 contrast image to be obtained in a short time and the signal-to-noise ratio to be improved.

A magnetic resonance imaging apparatus according to the present invention, which is based on a multi-slice divisional-scanning method which acquires an echo signal for one slice in several scans and acquires echo signals for multiple slices in a single pulse sequence, is characterized by selecting a different slice with each acquisition of an echo signal.

According to the magnetic resonance imaging apparatus of the present invention, since successive selection of a slice can be avoided in acquisition of each echo signal, the acquisition of an echo signal from each slice is not affected by the transverse relaxation of other slices even if a time interval between successive acquisition of echo signals is made short. Therefore, T2 contrast images with high signal-to-noise ratio can be obtained from a number of slices in a short time.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 illustrates a pulse sequence according to the first embodiment;

DETAILED DESCRIPTION OF THE PREFERRED EMBODIMENTS

Figure 3:
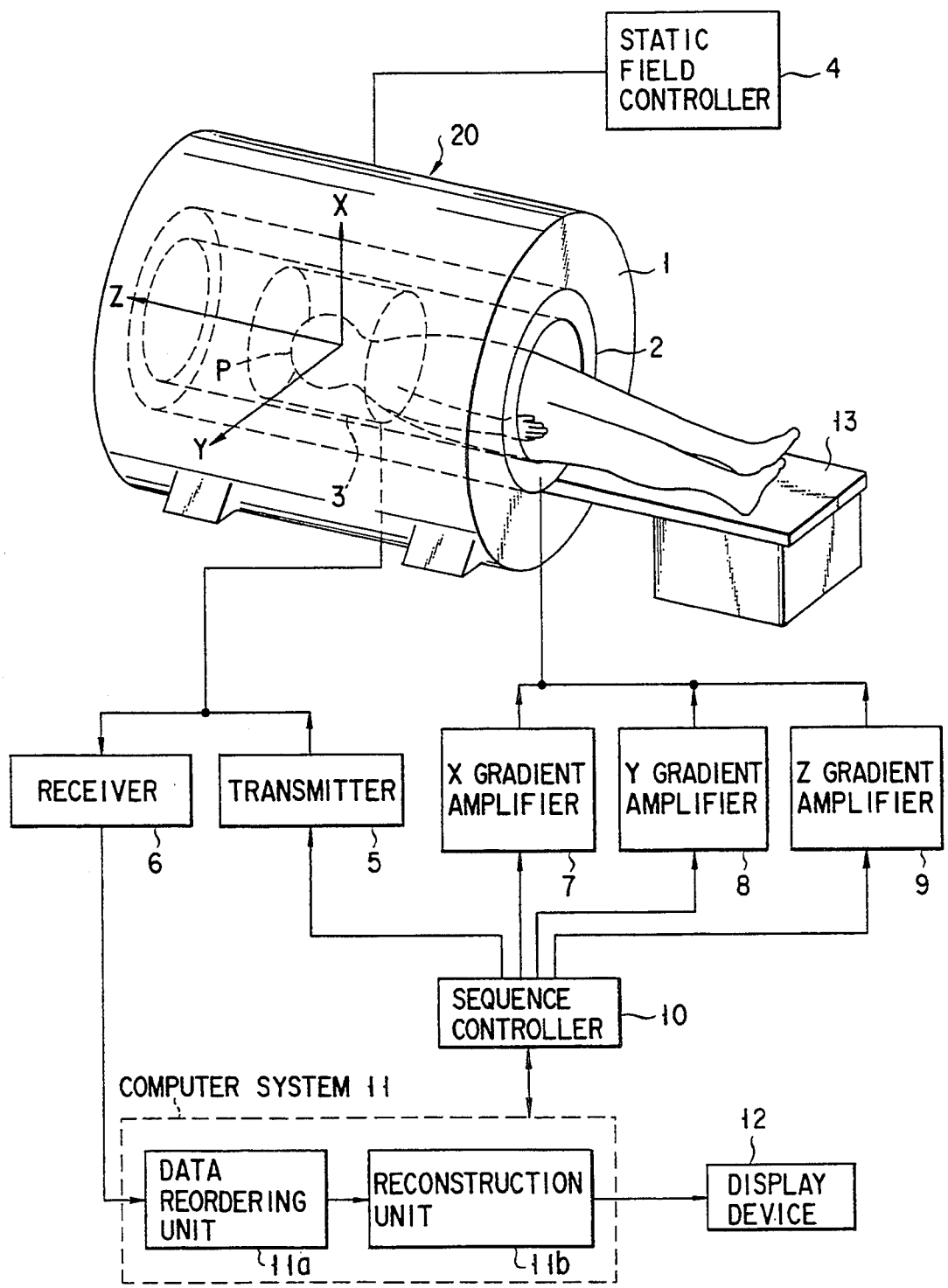
FIG. 3 is a block diagram of a first embodiment of a magnetic resonance imaging apparatus according to the present invention.

A preferred embodiment of a magnetic resonance imaging apparatus according to the present invention will now be described with reference to the accompanying drawings. Referring now to FIG. 3, there is illustrated a magnetic resonance imaging apparatus of the present invention in block form. A static magnetic field forming magnet 1, an x-axis, y-axis, and z-axis gradient magnetic fields forming coil system 2, and a transmitter/receiver coil system 3 are installed in a gantry 20. The transmitter/receiver coil 3 may be directly attached to a human body P under examination instead of being embedded in the gantry.

The magnet 1, serving as a means of forming a static magnetic field, can be constructed of a superconducting or normal-conducting coil. The x-axis, y-axis, and z-axis gradient fields forming coil system 2 is adapted to generate an x-axis gradient field Gx, a y-axis gradient field Gy, and a z-axis gradient field Gz. The transmitter/receiver coil 3 emits a radio-frequency (RF) pulse serving as a selective excitation pulse for selecting a slice to be imaged of the human body P and detects a magnetic resonance signal (echo signal) generated by magnetic resonance induced in the selected slice. The human body P, laid down an examination couch 13, is allowed to have access to the imaging space within the gantry 20. The imaging space is a spherical space in which imaging magnetic fields are formed, and imaging diagnosis can be made only when an imaging portion of the human body lies within this space.

The static magnetic field forming magnet 1 is driven by a static field controller 4. The transmitter/receiver coil 3 is coupled to a transmitter 5 at the time of inducing magnetic resonance in the human body and to a receiver 6 at the time of detecting magnetic resonance signals from the human body. The x-axis, y-axis, and z-axis gradient fields forming coil system 2 is driven by x-axis, y-axis, and z-axis gradient field power supplies (amplifiers) 7, 8, and 9.

The x-axis, y-axis, and z-axis gradient field amplifiers 7, 8, and 9, and the transmitter 5 are driven by a sequence controller 10, thereby generating an x-axis gradient field Gx, a y-axis gradient field Gy, a z-axis gradient field Gz, and a radio-frequency (RF) pulse in accordance with a predetermined pulse sequence which will be described later. In this case, the gradient fields Gx, Gy, and Gz are used as a phase-encoding gradient field Ge, a readout gradient field Gr, and a slice-selection gradient field Gs, respectively. A computer system 11 drives and controls the sequence controller 10 and receives magnetic resonance signals from the receiver 6 for signal processing, thereby reconstructing a cross-sectional magnetic resonance (MR) image of the human body and displaying it on a display device 12. The computer system 11 is equipped with a data reordering unit 11a comprising a buffer memory, and a reconstruction unit 11b for performing Fourier transformation on magnetic resonance signals.

Next, the operation of the first embodiment will be described with reference to a pulse sequence of FIG. 4. If a 90° RF pulse P1 and a 180° RF pulse Q1 are successively applied at a time interval of TE/2, then an echo signal will be obtained after the elapse of a time of TE/2 from the application of the RF pulse Q1. Here, the 15 gradient fields Gs, Gr, and Ge are controlled so as to select the first slice #1 shown in FIG. 1. That is, the RF-pulse frequency is made a frequency corresponding to the position of the slice #1, the slice-selection gradient magnetic field Gs having an amplitude corresponding to the position of the slice #1 is applied, and the phase-encoding gradient magnetic field Ge having an encoding step corresponding to the region "a" in the k space is applied. The polarity of the readout gradient magnetic field Gr is reversed at regular intervals, and the phase-encoding gradient magnetic field Ge is applied each time the polarity of the magnetic field Gr is reversed. This permits an echo signal for the region "a" of the slice #1 to be acquired.

Figure 1:
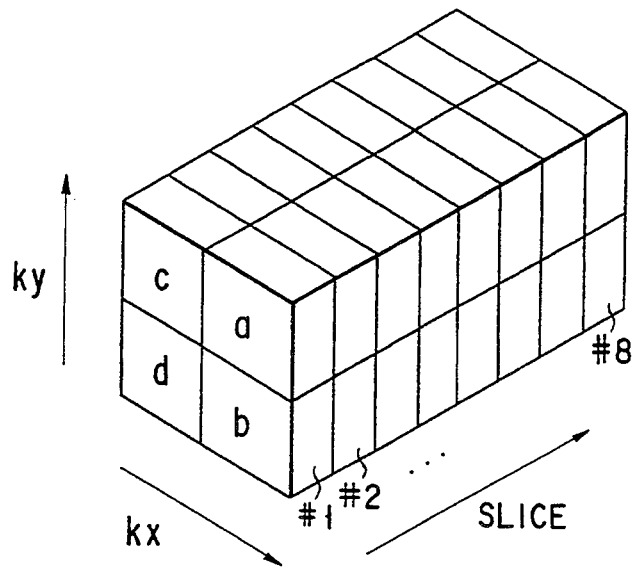
FIG. 1 is a diagram for use in explanation of a general multi-slice divisional-scanning method.
Figure 2:
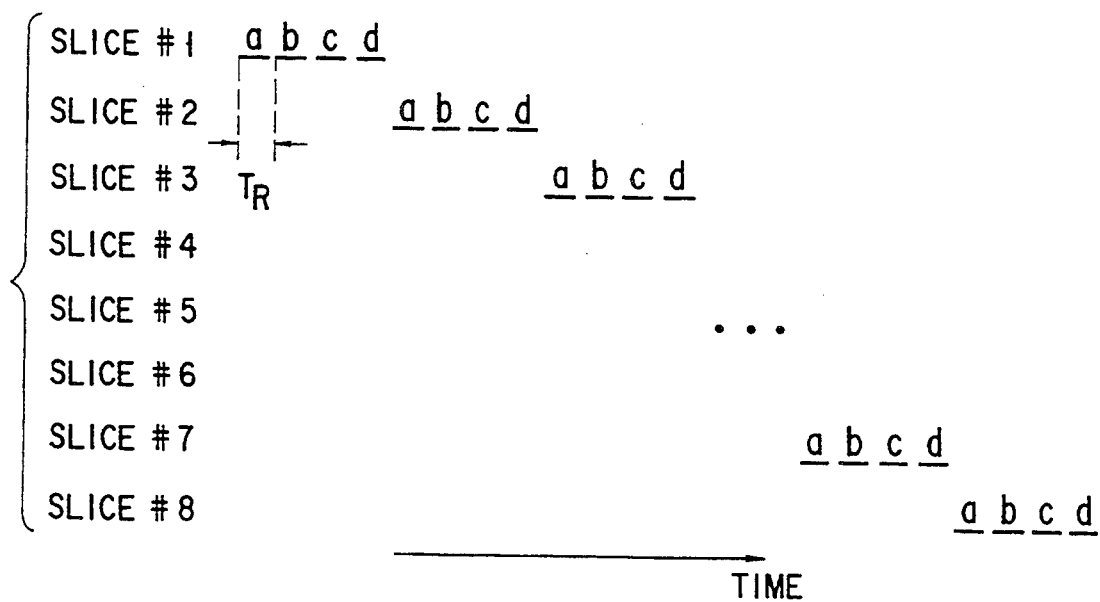
FIG. 2 illustrates the sequence of the multi-slice divisional-scanning of FIG. 2.

Next, in order to select the slice #2 shown in FIG. 1, a 90° pulse P2, which is somewhat different in frequency from the 90° pulse P1, is applied after the elapse of a time interval TR' from when the pulse P1 was applied. As in the case of the slice #1, the subsequent application of a 180° pulse and gradient magnetic fields Gs, Gr, and Ge permits information on the region "a" of the slice #2 to be obtained. The same procedure is continued until an echo signal for the region "a" of the slice #8 is obtained. FIG. 4 illustrates the acquisition of echo signals from the region "a" of the respective slices #1 to #8.

At the completion of the pulse sequence for the region "a" of the slices #1 to #8, an RF pulse P1 is applied so as to select the first slice #1. At this point, it is an encoding step of the phase-encoding gradient magnetic field Ge that differs in imaging parameter from when the slice #1 was selected previously. A different encoding step of the phase-encoding gradient magnetic field Ge permits information on the region "b" of the slice #1 on the k space shown in FIG. 1 to be obtained.

Figure 5:
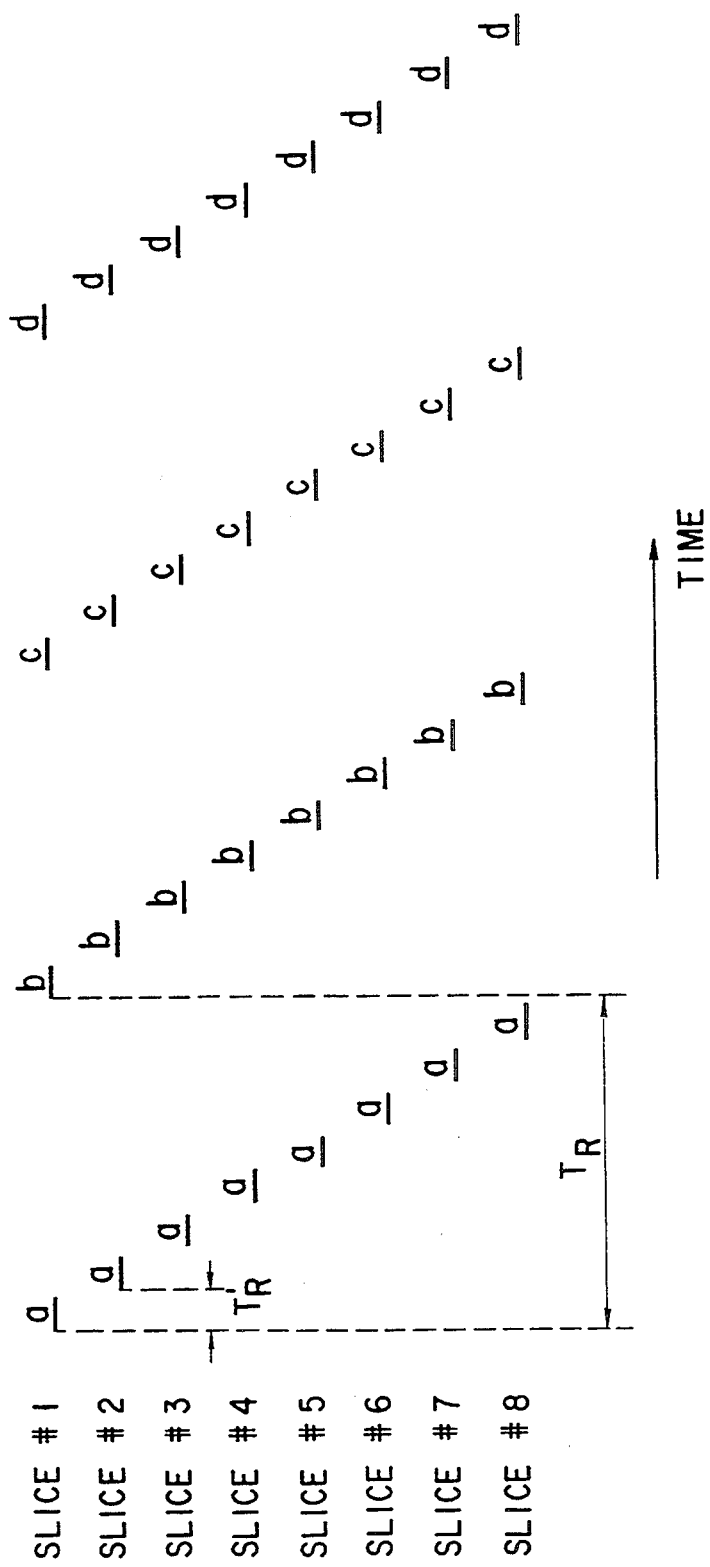
FIG. 5 illustrates the sequence of the multi-slice divisional-scanning in the first embodiment.

The next application of a 90° RF pulse permits the slice #2 to be selected, so that an echo signal for the region "b" of the slice #2 is acquired. It is supposed here that an echo signal for a region "n" of a slice #m is represented by data m-n. Then, in subsequent steps data 3-b, 4-b, ..., 8-b, 1-c, 2-c, ..., 8-c, 1-d, 2-d, ..., 8-d will be obtained in this sequence, thereby completing the multi-slice divisional-scanning imaging. The sequence of data acquisition is illustrated in FIG. 5.

Thus, the following data with 4 rows and 8 columns (data in each row indicates data for a corresponding region) are entered into the data reordering unit 11a and written into its memory area.

| 1-a, | 2-a, | 3-a, | 4-a, | 5-a, | 6-a, | 7-a, | 8-a |
| 1-b, | 2-b, | 3-b, | 4-b, | 5-b, | 6-b, | 7-b, | 8-b |
| 1-c, | 2-c, | 3-c, | 4-c, | 5-c, | 6-c, | 7-c, | 8-c |
| 1-d, | 2-d, | 3-d, | 4-d, | 5-d, | 6-d, | 7-d, | 8-d |

The data reordering unit 11a rearranges the input data arrangement into the following arrangement with 8 rows and 4 columns (data in each row indicates data for a corresponding slice).

| 1-a, | 1-b, | 1-c, | 1-d |
| 2-a, | 2-b, | 2-c, | 2-d |
| 3-a, | 3-b, | 3-c, | 3-d |
| 4-a, | 4-b, | 4-c, | 4-d |
| 5-a, | 5-b, | 5-c, | 5-d |
| 6-a, | 6-b, | 6-c, | 6-d |
| 7-a, | 7-b, | 7-c, | 7-d |
| 8-a, | 8-b, | 8-c, | 8-d |

The two-dimensional Fourier transformation of data for each row in the above data arrangement by the reconstruction unit 11b will reconstruct an MR image of a respective one of the slices #1 to #8. It is assumed here that TE=80 ms and TR' (the period of the 90° pulse used to acquire each echo signal)=150 ms, the 90° pulse repetition time for 8 slices TR will be TR=8×TR'=1,200 ms. Thus, it will be understood that, even if the data acquisition time TR' for each slice is made short, the repetition time TR can be made long enough to lose the effect of the transverse relaxation, and hence T2 contrast images can be obtained.

As described above, according to the first embodiment, the repetition time TR can be increased by a factor of the number of slices, 8 in this example, without lengthening the scan time because the slice to be selected is shifted one by one every time a 90° pulse is applied.

In general, an MR echo signal S is given by $$S = A(1-\exp(-TR/T1)) \times \sin \alpha / (1-\exp(-TR/T1) \times \cos \alpha)$$

where A: proportional constant
T1: longitudinal relaxation time
TR: 90° pulse repetition time
α: flip angle It is when the denominator in the above equation is 0, that is, $\alpha = \cos^{-1}(\exp(-TR/T1))$ that the echo signal S becomes maximum. It will thus be seen that the larger TR is, the larger the flip angle α and the signal amplitude become. For example, in the case of T1 = 1,000 ms (suppose that the power of the static magnetic field is 1.5T at the abdomen of a human body), if TR = 100 ms, then the echo signal becomes maximum (S = 0.525) when α = 25.2°. Moreover, if TR = 1,000 ms, then the echo signal becomes maximum (S = 0.731) when α = 68.4°. Furthermore, if TR = ∞, then the echo signal becomes maximum (S = 1.0) at α = 90°. Thus, by lengthening the repetition time TR, the signal magnitude can also be increased. As a result, if the repetition time TR is prolonged from 100 ms to 1,000 ms, then the signal-to-noise ratio will be improved by approximately 40%.

According to the first embodiment, as described above, echo signals are acquired for corresponding regions of all of slices with the selected slice shifted by one with each acquisition of an echo signal (i.e., with each application of a 90° pulse), and then echo signals are acquired for next corresponding regions of all the slices, thereby permitting the RF pulse repetition time TR to be prolonged considerably (by a factor of the number of slices) in comparison with the prior art without making the entire scan time long and T2 contrast images with high signal-to-noise ratio to be obtained in a short time. Usually, a human being can hold his or her breath (bring his or her body to rest) for about 10 seconds. The application of the present embodiment to examination of the abdomen of a human body permits T2 contrast images of multiple slices to be obtained at a time during a breath holding period, which is useful for diagnosis of tissues such as liver tumor.

Figure 6:
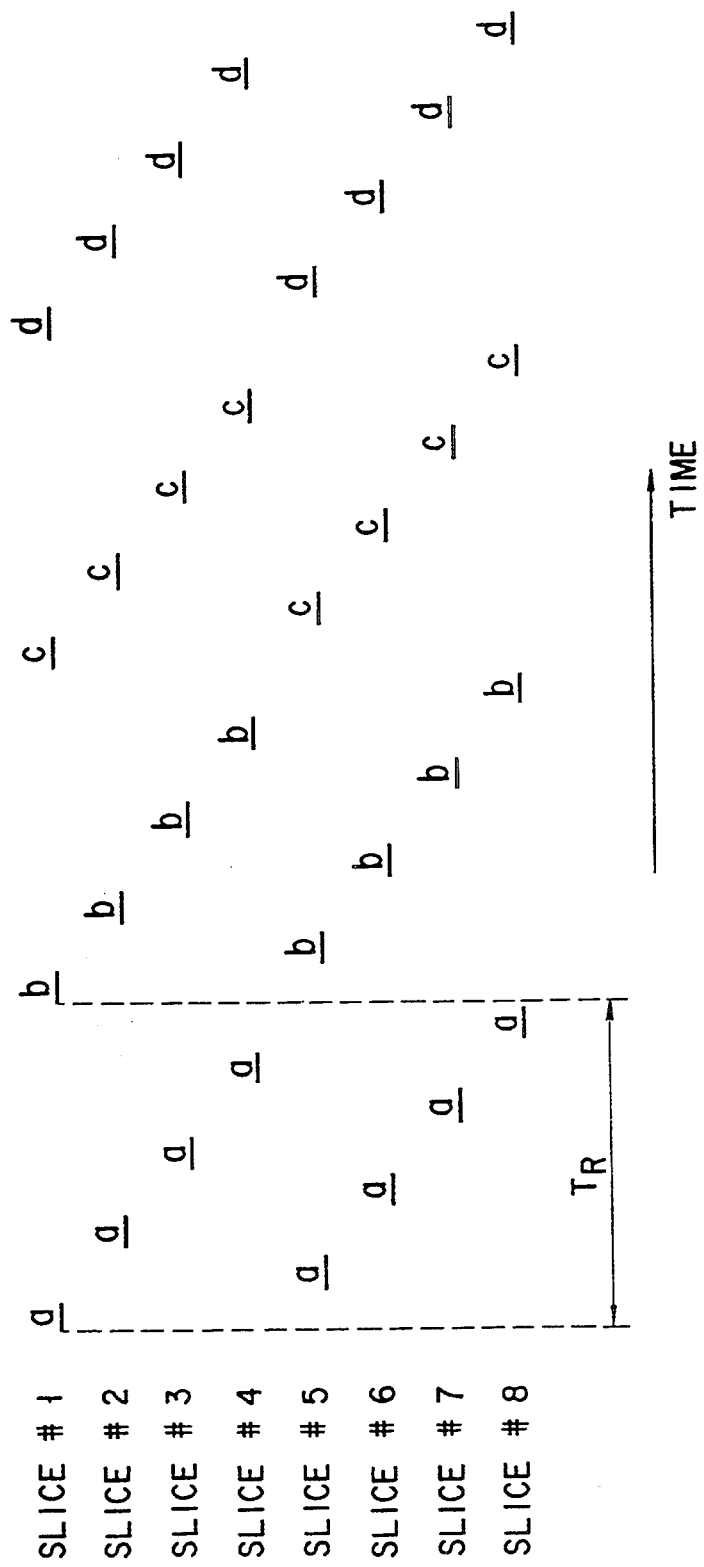
FIG. 6 illustrates the sequence of the multi-slice divisional-scanning method according to a second embodiment of the present invention.

Next, other embodiments will be described. In the first embodiment, as shown in FIG. 5, the selection and excitation of a slice shift to the next slice every time a 90° pulse is applied. Thus, if slice characteristics are poor, the adjoining slices will influence each other. For this reason, instead of selecting adjoining slices in sequence, a second embodiment divides multiple slices into first and second groups of four successive slices and selects a slice alternately from the first and second groups as shown in FIG. 6. In this case, the data arrangement will be as follows:

| 1-a | 5-a | 2-a | 6-a | 3-a | 7-a | 4-a | 8-a |
| 1-b | 5-b | 2-b | 6-b | 3-b | 7-b | 4-b | 8-b |
| 1-c | 5-c | 2-c | 6-c | 3-c | 7-c | 4-c | 8-c |
| 1-d | 5-d | 2-d | 6-d | 3-d | 7-d | 4-d | 8-d |

This permits MRI apparatus with poor slice characteristics to image each slice with great accuracy. The second embodiment may be modified in various ways unless the adjoining slices are selected successively. For example, the slices may be selected such that the odd-numbered slices are first selected and then the even-numbered slices are selected as #1, #3, #5, #7, #2, #4, #6, and #8.

Figure 7A:
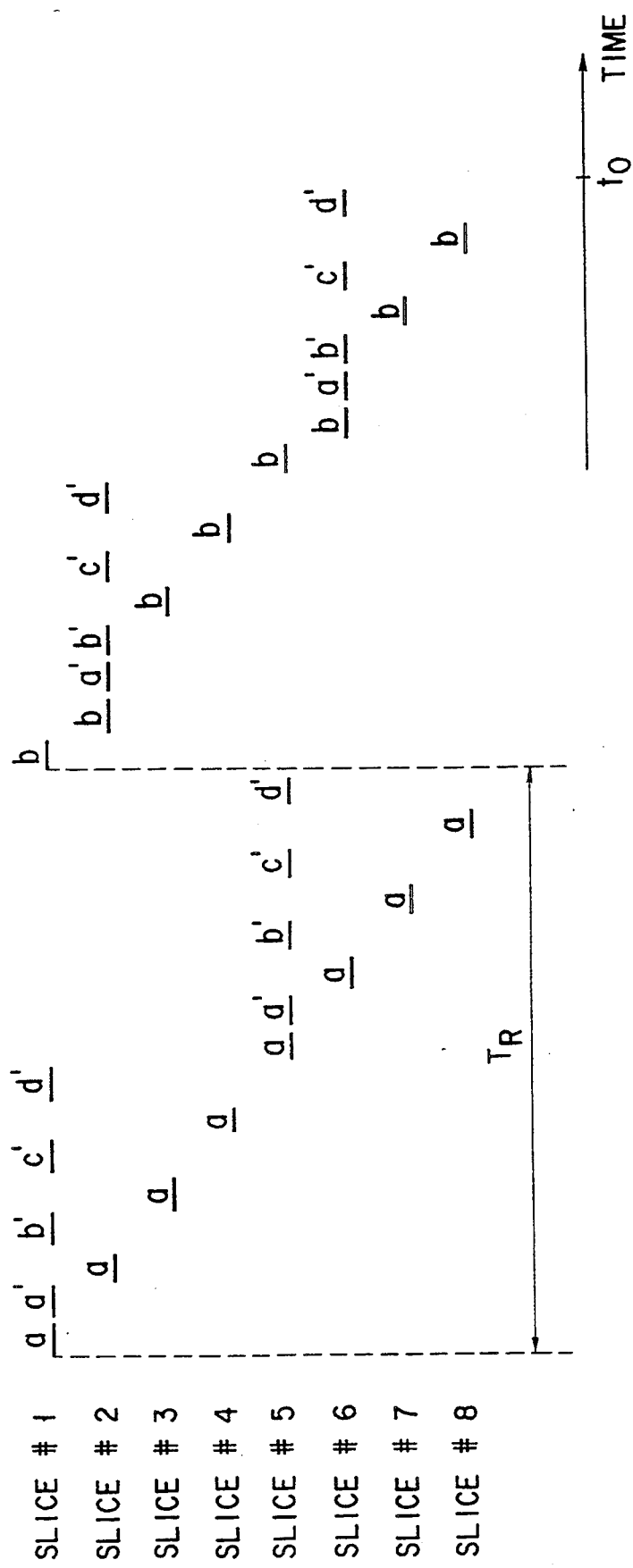
FIGS. 7A and 7B illustrate the sequence of the multi-slice divisional-scanning method according to a third embodiment of the present invention.
Figure 7B:
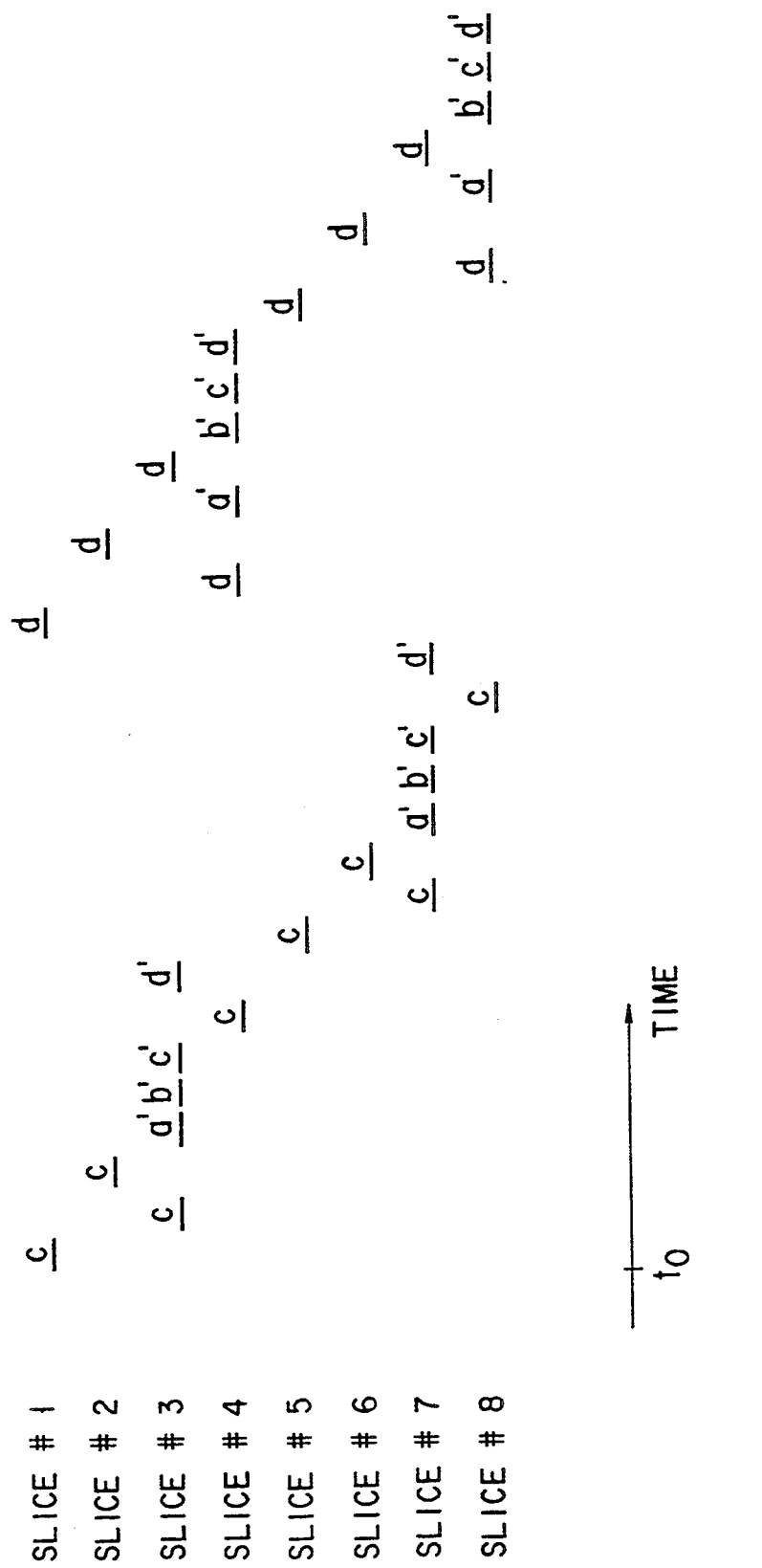

FIGS. 7A and 7B illustrate the sequence of data acquisition according to a third embodiment of the present invention.

The above-described embodiments are directed to only the imaging sequence for T2 contrast images. It is sometimes desired to obtain T1 contrast images and T2 contrast images simultaneously. The third embodiment is adapted to meet such a requirement. In FIGS. 7A and 7B, "a", "b", . . . indicate the sequence for T2 contrast images, while "a'", "b'", . . . indicate the sequence for T1 contrast images. For example, it is required to set TR at about 1,000 ms and TE at about 100 ms for the T2 contrast image sequence, and TR at about 100 ms and TE at about 30 ms for the T1 contrast image sequence.

By interleaving an echo signal acquisition interval in the sequence for T1 contrast images between echo signal acquisition intervals in the sequence for T2 contrast images, the repetition time TR in the sequence for T2 contrast images can be increased by a factor of 2 over the first embodiment, that is, by a factor of 16 over the prior art; while, in the sequence for T1 contrast images, the repetition time is the same as that in the prior art or increased by a factor of two over the prior art. Correspondingly the signal-to-noise ratio will also be improved.

As shown in FIGS. 7A and 7B, in the sequence for T2 contrast images according to the third embodiment, the slices are selected in the same sequence as in the first embodiment. Alternatively, the sequence for T1 contrast images shown in FIGS. 7A and 7B may be combined with the sequence for T2 contrast images in which the slices are selected in such a sequence as in the second embodiment shown in FIG. 6. Any combination of the sequence for T2 contrast images and the sequence for T1 contrast images may be used.

According to the magnetic resonance imaging apparatus of the present invention, as described above, the divisional-scanning technique in which an echo signal for a single slice is acquired in several scans and the multi-slice technique in which echo signals for a plurality of slices are acquired in a single pulse sequence are combined, and a slice to be selected is changed with each data acquisition while data acquisition is repeated, thereby preventing adjoining slices from being selected successively. This permits the RF pulse repetition time TR for one slice to be made long as compared with the prior art even if a data acquisition time interval is made short and T2 contrast images with high signal-to-noise ratios for a number of slices to be obtained in a short time.

Figure 8:
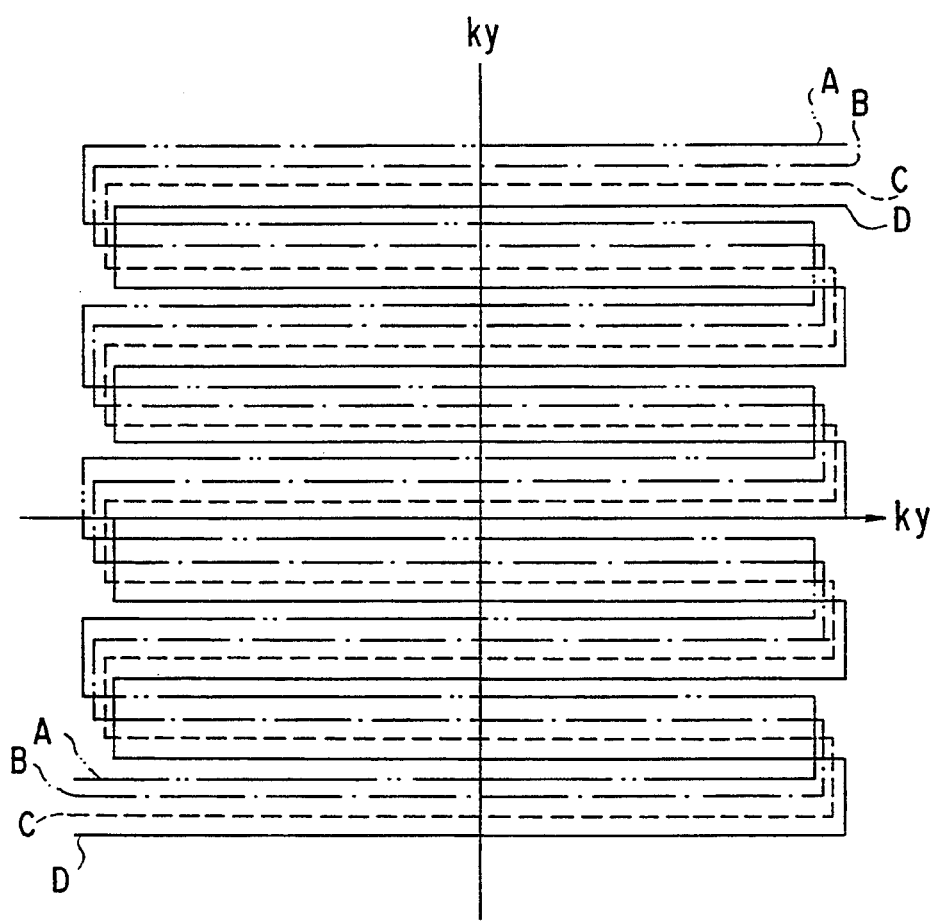
FIG. 8 is a diagram for use in explanation of a modification of the divisional-scanning method of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, although the number of multiple slices was taken to be eight and the number of divisions of a slice was taken to be four, these numeric values are free to set. Although each slice is divided into two in each of the kx and ky directions in the k space, it may be divided either in the kx direction or in the ky direction. Although the pulse sequence for echo signal acquisition was described as using the echo planar imaging technique, another pulse sequence may be used instead. Further, the divisional-scanning method for each slice is not restricted to the individual scanning of each of two or more regions into which the slice is spatially divided as described above. For example, as shown in FIG. 8, the divisional-scanning may be made such that a slice is subjected to a coarse scan with each data acquisition, the trajectory of the coarse scan is shifted little by little, and an echo signal for the entire slice is acquired in several scans indicated by the trajectories "A", "B", "C", and "D". This technique is called interleave scanning method, and its description is omitted because it is disclosed in U.S. patent application Ser. No. 879,748, entitled "Method and Apparatus for Rapid Resonance Imaging", filed May 6, 1992, and assigned to the same assignee as the present invention.

What is claimed is:

1. A magnetic resonance imaging apparatus based on a multi-slice divisional-scanning method in which magnetic resonance signals for one slice are acquired in several scans and magnetic resonance signals for a plurality of slices are acquired in a single pulse sequence, comprising:

exciting means for selectively exciting a region on a Fourier space of one of a plurality of slices to acquire magnetic resonance signals from said region; and control means for controlling said exciting means to acquire magnetic resonance signals from all of regions of said plurality of slices, said exciting means being controlled to avoid successive excitation of the same slice.

2. The apparatus according to claim 1, in which said exciting means comprises means for performing a pulse sequence for a transverse relaxation enhancement image (T2 contrast image).

3. The apparatus according to claim 1, in which said control means controls said exciting means so as to acquire magnetic resonance signals from all of said slices in sequence for each of regions.

4. The apparatus according to claim 3, in which said control means controls said exciting means so as to select adjoining slices in sequence with each data acquisition.

5. The apparatus according to claim 3, in which said control means controls said exciting means so as to select non-adjusting slices in sequence with each data acquisition.

6. The apparatus according to claim 3, in which said control means comprises means for rearranging magnetic resonance signals acquired for each of regions of said slices into magnetic resonance signals for each of said slices.

7. The apparatus according to claim 1, in which said exciting means comprises means for acquiring magnetic resonance signals in accordance with a pulse sequence for an echo planar imaging method.

8. The apparatus according to claim 1, in which said exciting means comprises means for acquiring magnetic resonance signals for each of regions into which a slice is divided in two directions orthogonal to each other on the Fourier space.

9. The apparatus according to claim 1, in which said exciting means comprises means for acquiring magnetic resonance signals of a slice in several scans, trajectories of the several scans interleaving the slice on the Fourier space.

10. A magnetic resonance imaging apparatus based on a multi-slice divisional-scanning method in which magnetic resonance signals for one slice are acquired in several scans and magnetic resonance signals for a plurality of slices are acquired in a single pulse sequence, comprising:

first acquiring means for selectively exciting a region on a Fourier space of one of the plurality of slices and acquiring magnetic resonance signals from said region to thereby obtain a transverse relaxation enhancement image (T2 contrast image);

second acquiring means for selectively exciting a region on a Fourier space of one of the plurality of slices and acquiring magnetic resonance signals from said region to thereby obtain a longitudinal relaxation enhancement image (T1 contrast image); and control means for controlling said first and second acquiring means alternately to acquire magnetic resonance signals from all of regions of said plurality of slices, wherein said first acquiring means is controlled so as to select adjoining slices successively, and said second acquiring means is controlled to avoid successive excitation of the same slice.

11. The apparatus according to claim 10, in which said control means controls said first acquiring means so as to acquire magnetic resonance signals from all of said slices in sequence for each of regions.

12. The apparatus according to claim 11, in which said control means controls said first acquiring means so as to select adjoining slices in sequence with each data acquisition.

13. The apparatus according to claim 11, in which said control means controls said first acquiring means so as to select non-adjoining slices with each data acquisition.

14. The apparatus according to claim 10, in which said control means includes means for rearranging magnetic resonance signals acquired by said first acquiring means for each of regions of said slices into magnetic resonance signals arranged for each of said slices.

15. The apparatus according to claim 10, in which said first and second acquiring means comprise means for acquiring magnetic resonance signals in accordance with a pulse sequence for an echo planar imaging method.

16. The apparatus according to claim 10, in which said first and second acquiring means comprise means for acquiring a magnetic resonance signals for each of regions into which a slice is divided in two directions orthogonal to each other on the Fourier space.

17. The apparatus according to claim 10, in which said first and second acquiring means comprises means for acquiring magnetic resonance signals of a slice in several scans, trajectories of the several scans interleaving the slice on the Fourier space.

18. A magnetic resonance imaging method comprising the steps of:

(a) selectively exciting a region on a Fourier space of a plurality of slices to acquire magnetic resonance signals for the region;

(b) repeating said step (a) a number of times equal to the number of said slices to acquire magnetic resonance signals for corresponding regions of said slices while avoiding successive excitation of the same slice;

(c) repeating said step (b) to acquire magnetic resonance signals for all of regions of said slices;

(d) rearranging magnetic resonance signals obtained by said steps (b) and (c) and arranged for each of said regions into magnetic resonance signals arranged for each of said slices; and (e) reconstructing a magnetic resonance image on the basis of said magnetic resonance signals rearranged in said step (d).

19. The method according to claim 18, in which said step (b) shifts a slice to be excited by said step (a) to the next slice to thereby repeat said step (a).

20. The method according to claim 18, in which said step (b) shifts a slice to be excited by said step (a) to a slice that is not next to the former to thereby repeat said step (a).

21. The method according to claim 18, in which said step (a) includes a substep (a1) of performing a transverse relaxation enhancement (T2 contrast) imaging sequence and a substep (a2) of performing a longitudinal relation enhancement (T1 contrast) imaging sequence, and in which said step (b) performs said steps (a1) and (a2) alternately while repeating said step (a1) the number of times corresponding to the number of said slices.

* * * * *